United States Patent [19]
Van De Pas et al.

[11] Patent Number: 5,468,683
[45] Date of Patent: Nov. 21, 1995

[54] METHOD OF MANUFACTURING AN OPTOELECTRONIC SEMICONDUCTOR DEVICE HAVING A SINGLE WIRE BETWEEN NON-PARALLEL SURFACES

[75] Inventors: Hermanus A. Van De Pas, Wijchen; Rudolf P. Tijburg; Johannes A. De Poorter, both of Eindhoven, all of Netherlands

[73] Assignee: U.S. Philips Corporation, New York, N.Y.

[21] Appl. No.: 125,375

[22] Filed: Sep. 22, 1993

Related U.S. Application Data

[63] Continuation-in-part of Ser. No. 110,598, Aug. 23, 1993, abandoned.

[30] Foreign Application Priority Data

Sep. 25, 1992 [EP] European Pat. Off. ............ 92202949

[51] Int. Cl.⁶ ............................................ H01L 21/60
[52] U.S. Cl. .................... 437/209; 437/3; 437/183; 437/904; 437/905; 437/906; 228/4.5; 228/180.22; 228/180.5; 228/904
[58] Field of Search ................. 437/209, 3, 183, 437/904, 905, 906; 228/4.5, 904, 180.22, 180.5

[56] References Cited

U.S. PATENT DOCUMENTS

| | | | |
|---|---|---|---|
| 3,838,501 | 10/1974 | Umbaugh | 437/209 |
| 5,077,143 | 12/1991 | Barraclough et al. | 437/905 |

FOREIGN PATENT DOCUMENTS

| | | | |
|---|---|---|---|
| 0013374 | 2/1978 | Japan | 437/905 |
| 0027981 | 3/1981 | Japan | 437/905 |
| 0112766 | 9/1981 | Japan | 437/905 |
| 0013747 | 1/1982 | Japan | 437/209 |
| 56-43700 | 10/1982 | Japan . | |
| 0139433 | 8/1983 | Japan | 437/209 |
| 57-85870 | 11/1983 | Japan . | |
| 0044836 | 3/1984 | Japan | 437/209 |
| 0115239 | 6/1985 | Japan | 437/209 |
| 0010249 | 1/1986 | Japan | 437/209 |
| 0238630 | 10/1987 | Japan | 437/209 |
| 0269539 | 11/1988 | Japan | 437/209 |
| 0098273 | 4/1989 | Japan | 437/905 |
| 0289151 | 11/1989 | Japan | 437/209 |
| 2-86184 | 3/1990 | Japan . | |

*Primary Examiner*—Olik Chaudhuri
*Assistant Examiner*—Long Pham
*Attorney, Agent, or Firm*—Michael J. Balconi-Lamica

[57] ABSTRACT

Optoelectronic devices often comprise an optoelectronic semiconductor element such as a diode laser fastened on a carrier. The desired path of a beam of radiation from or to such an element often implies that such an element has to be fastened on the carrier at a certain, for example right angle. As a result, a contact surface of such an element also encloses an angle with another contact surface which lies on the carrier. In a method according to the invention, one of the two contact surfaces is provided with a wire which has a free end, and after fastening of the diode laser or photodiode the free end of the wire is fastened on the other contact surface. One wire connection can suffice and no auxiliary block is necessary with this wire connection method in two steps. Preferably, the wire having the free end is provided on the element. This has various additional advantages such as a less critical fastening of the free end of the wire and the possibility of a reliable intermediate test owing to which the yield of the expensive end product is increased.

13 Claims, 1 Drawing Sheet

METHOD OF MANUFACTURING AN OPTOELECTRONIC SEMICONDUCTOR DEVICE HAVING A SINGLE WIRE BETWEEN NON-PARALLEL SURFACES

This is a continuation-in-part of application Ser. No. 08/110,598, filed Aug. 23, 1993, now abandoned.

BACKGROUND OF THE INVENTION

The invention relates to a method of manufacturing an optoelectronic semiconductor device which comprises an optoelectronic semiconductor element—usually called element hereinafter for short—, which element provided with a first contact surface is fastened to a carrier provided with a second contact surface, the element being so fastened on the carrier that the two contact surfaces enclose an angle with one another and an electrical connection between the two contact surfaces is formed by at least one wire connection. The invention also relates to an element suitable for use in such a method.

Such a method is frequently used in the manufacture of, for example, a semiconductor diode laser comprising optoelectronic devices which form part of a read and/or write head of information-processing equipment such as laser printers, bar code readers, read and/or write devices for optical registration carders such as CD (Audio) and CDROM (data) discs and of systems for optical glass fibre communication. The desired direction of a radiation beam from and to such an element often demands such a spatial orientation of the element that a contact surface of the element will have an angled position relative to a contact surface of the carrier after its fastening on this carrier. When a wire connection is to be made between the two contact surfaces by means of a wire bonding unit, accordingly, at least one of these contact surfaces will be at an angle relative to the head of the wire bonding unit. The provision of a wire connection by means of a wire bonding unit thus becomes problematic or even impossible.

A method of the kind mentioned in the opening paragraph is known from JP(A) 2-86184 published in Patent Abstracts of Japan, vol. 13, no. 273(E-940){4216} of Jun. 13, 1990. This describes and shows how an element, i.e. a diode laser 1, is so mounted on a carrier 3 that the radiation beam of the diode laser 1 is perpendicular to the carrier 3, so that a first contact surface of the diode laser 1, here the upper surface thereof, is at right angles to a second contact surface present on the carrier 3, here the upper surface of a pin 11 provided in the carrier. An electrical connection between the two contact surfaces is formed here by two wire connections and an interposed insulating block 6 on which two mutually perpendicular and interconnected conductor tracks 5a, 5b are present. The two wire connections may be readily made by means of a wire bonding unit. This is because each wire connection is laid between two parallel surfaces, i.e. between the upper surface of pin 11 and the surface of track 5b, and between the upper surface of diode laser 1 and the surface of track 5a. The problem of providing an electrical connection between two contact surfaces which are at an angle relative to one another is solved in this manner.

A disadvantage of the known method is that it is laborious and expensive. Indeed, two wire connections are made, the device or the wire bonding unit must be rotated between making of the wire connections, and an additional component is used. Naturally, optoelectronic devices manufactured by the known method are expensive as a result.

SUMMARY OF THE INVENTION

The present invention has for its object inter alia to provide a method of the kind mentioned in the opening paragraph by which a wire connection is obtained between two contact surfaces which are at an angle relative to one another in a simple and inexpensive manner and preferably by means of a wire bonding unit.

According to the invention, a method of the kind mentioned in the opening paragraph is for this purpose characterized in that the wire connection is formed in that a wire having a free end is applied to one of the two contact surfaces and, after fastening of the element on the carrier, the free end of the wire is fastened to the other contact surface. The invention is based inter alia on the recognition that the problem of making a wire connection between two contact surfaces which enclose an angle is solved by providing the wire connection in two steps. In a first step, one of the two contact surfaces is provided with a wire of which only one end is fastened to the element, and the other end is rendered free. This may be realised in that first a wire is fastened on the one contact surface, preferably by means of a wire bonding unit, and then this wire is cut off at a distance from the element, for example, by means of a device utilizing a flame or spark. The element is fastened on the carrier before or after the wire is applied. The element is so tilted in the method that an orientation desired for the optical operation is achieved. This implies that the first contact surface (of the element and the second contact surface (of the carrier), between which the wire connection is desired, will also be at an angle relative to one another. The free end of the wire at the same time comes in the vicinity of the other contact surface during this. In a second step, preferably also by means of a wire bonding unit, the free end of the wire is fastened to the other contact surface. Wire length is preferably chosen so that it corresponds at least to the distance to be bridged between the two contact surfaces. According to the invention, one single wire bond between two contact surfaces enclosing an angle with one another is thus realised in a very simple manner and without the use of additional components.

In an important preferred embodiment, the wire having the free end is applied to the first contact surface, and thus to the element, before the element is fastened on the carrier. After this the element is fastened on the carrier, and then the free end of the wire is fastened to the second contact surface. Since the contact surface on the carrier is usually much larger than the contact surface on the element, the alignment of the free end of the wire relative to the contact surface of the carrier is much less critical, thanks to the previous application of the wire to the contact surface of the element, than in the opposite case. This renders the method according to the invention easier and therefore cheaper. The application of the wire to the element before the fastening thereof on the carrier has the further advantage that the wire can be provided more easily because the element has not yet been tilted then. Finally, the method according to this embodiment has the important advantage that in this manner the element is (substantially) not exposed to external forces anymore after the wire has been applied, by which forces optoelectronic elements, especially diode lasers, can very easily become damaged. This implies that testing of the element and the provision of the wire thereon forms a reliable indication for the end product. This possibility of an intermediate and reliable test will cause the reject rate of the comparatively expensive end product to be lower.

Especially when the element is a diode laser, it will preferably be fastened on a support body, which may also function as a heat sink, and the support body is fastened on the carrier. The risk of damage to the diode laser during its manipulation and fastening is reduced by this, as it is reduced by the provision of the wire on the diode laser before the fastening thereof on the carrier. This renders the intermediate test referred to above even more reliable.

In a further modification, the wire having the free end is given an angle relative to the one contact surface, which angle is chosen to be approximately equal to the angle which the contact surfaces will enclose after fastening of the element on the carrier. After fastening of the element on the carrier, the wire will run approximately parallel to the other contact surface when such an angle is provided in the wire having the free end. As a result, the free end can be more easily fastened on this contact surface. This renders the latter fastening simpler. The angle may be provided in that the wire bonding unit is moved away from the element in the correct direction and at the desired angle after the wire has been fastened, for example on the element, but before cutting off of the wire. Alternatively, the wire may readily be bent in the correct direction and through the correct angle by means of a suitable instrument after cutting. A suitable instrument, for example, is a two-pronged fork. The wire may also be given the correct angle after the element has been fastened on the carrier. All this illustrates an additional advantage of the method according to the invention, i.e. that it is comparatively well suited to mechanisation.

As was noted above, both fastening of the wire on the one contact surface and fastening of the free end on the other contact surface is preferably done by means of thermocompression or ultrasonic bonding. These are simple and reliable techniques which are often at hand already, which has important advantages. Preferably, bump connections are used at least for providing the wire having the free end on the one contact surface. As a result, a wire fastened on a contact surface has a secure base, which enhances the stability of the wire.

The tilting necessary for a good optical operation of the element may be realised in various ways. Preferably, the element or the support body is tilted before being fastened on the carrier and is fastened to the carrier with a side surface of the element or of the support body which encloses an angle with the first contact surface. Tilting may alternatively be achieved in that a portion of the carrier is provided with a sloping surface. The element or support body is then fastened with its bottom surface on this sloping portion.

A method according to the invention is particularly interesting when the two contact surfaces enclose an angle of between 10° and 90° with one another. Between 0 and approximately 10° it is possible to make a direct wire connection between the contact surfaces by means of wire bonding when a gold wire, bump connections and thermocompression bonding are used. In other cases, the maximum value for the angle is even smaller than 10°, for example, approximately 5°.

The invention also relates to an optoelectronic semiconductor element, possibly fastened on a support body, provided with a contact surface on which a wire having a free end is fastened, and suitable for use in a method according to one of the preceding claims. Preferably, such an element forms part of a series of elements which are present on a series of support bodies which are interconnected by means of break-off edges. Large numbers of such support bodies provided with elements and wires may thus be manufactured and tested in this manner. The use of such an element renders the method according to the invention even less expensive. For the method of manufacture of such a series of support bodies, the reader is referred to a European Patent Application filed by Applicant on Sep. 7, 1992 with the Application no. 92202694.3.

BRIEF DESCRIPTION OF THE DRAWING

The invention will now be explained in more detail with reference to an embodiment and the accompanying drawing, in which FIGS. 1 to 4 diagrammatically show an embodiment of a method according to the invention for the manufacture of an optoelectronic device comprising an optoelectronic semiconductor element in side elevation and in subsequent stages of the manufacture.

DETAILED DESCRIPTION OF THE PREFERRED EMBODIMENT

Figure 1:
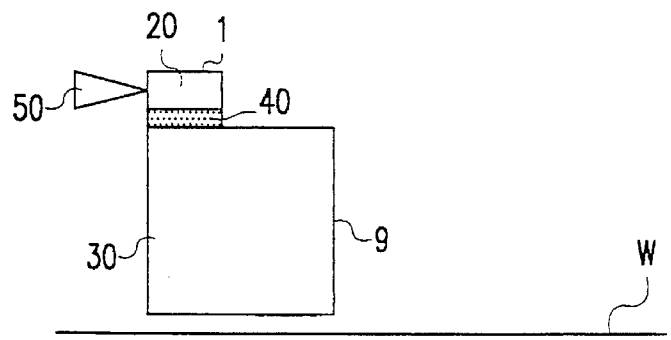

FIGS. 1 to 4 diagrammatically show an embodiment of a method according to the invention for the manufacture of an optoelectronic device having an optoelectronic semiconductor element in side elevation and in subsequent stages of the manufacture. On a working surface W (see FIG. 1), an element 20, here a diode laser 20, is fastened on a support body 30, here by means of indium solder 40. The support body 30 comprises a silicon block provided with a titanium and platinum layer and whose dimensions are approximately $1 \times 1 \times 1$ mm$^3$. The diode laser 20 is fastened at the edge of the support body 20 here in order that a radiation beam 50 generated in the diode laser 20 will not be reflected against the body. The diode laser 20 is provided with a first contact surface 1, here formed by the metallized upper surface of the diode laser 20. The diode laser is so fastened on a carrier 3 by means of the support body 30 (see FIG. 4) that the first contact surface 1 encloses an angle 4 with a second contact surface 2 of the carrier 3. The second contact surface 2 is here formed by the upper surface of a pin 11 which is passed through the carrier 3 with electrical insulation. In this example, the angle 4 is 90°, so that the radiation beam 50 will issue from the device perpendicularly to the carrier 3. The contact surfaces 1 and 2 are electrically interconnected by a wire connection 5.

Figure 2:
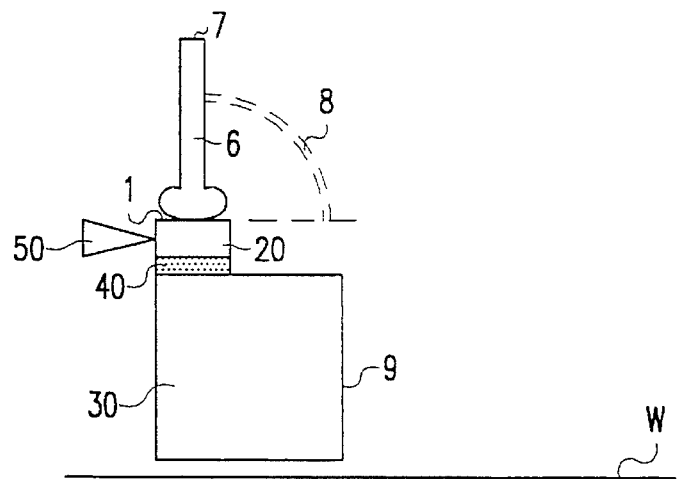
Figure 3:
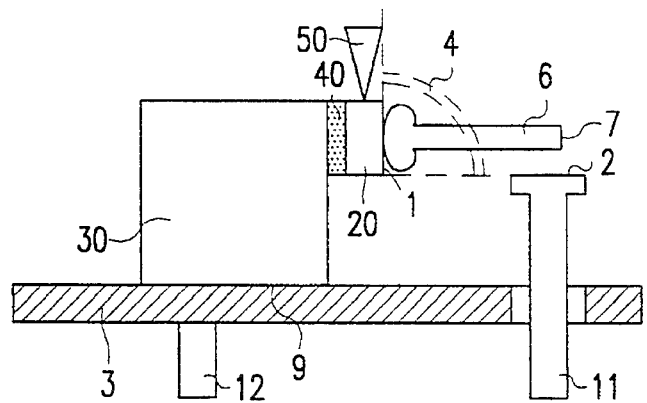

By a method according to the invention (see FIG. 2), a wire 6 having a free end 7 is provided on one of the two contact surfaces 1, 2—here on the first contact surface 1—, and after fastening of the diode laser 20 on the carrier 3 (see FIG. 3) the free end 7 of the wire 6 is fastened on the other contact surface 2, 1, in this case on the second contact surface 2. The manufacture of the wire connection 5 in two steps achieves that, in spite of the fact that the contact surfaces 1, 2 enclose an angle 4, only one wire connection 5 is necessary and no additional component is required, which is a great advantage. In addition, usually available wire bonding units such as thermocompression or ultrasonic (bump) wire bonders (not shown in the Figures) can be used for making the wire connection 5, at least during the first step thereof. The second step (fastening the free end 7 on the second contact surface) may also be carried out with a wire bonding unit. These are also important advantages. In the first step, the head of a wire bonding unit (not shown in the Figures) is first moved to above the diode laser 20 and, preferably, a bump connection of the wire 6 on the diode laser 20 is provided. After the head of the wire bonding unit has been moved up, the wire 6 is cut off at the desired length by means of a device (also not shown in the Figures)

utilizing a flame or spark, whereby the free end 7 is formed at the wire 6. The provision of the wire provided with the free end 7 on the diode laser 20, i.e. before the diode laser 20 is fastened on the carrier 3 as in the present example, offers major further advantages: since the second contact surface 2 is usually much larger than the first contact surface 1, the alignment of the free end 7 of the wire 6 relative to the second contact surface 2 is comparatively simple. In addition, (substantially) no external forces are exerted anymore on the diode laser 20 after the wire has been provided. As a result, testing of the diode laser 20 in the stage as depicted in FIG. 2 provides a reliable indication on the end product depicted in FIG. 4. The yield of comparatively expensive final products is increased by such a test. Owing to the comparatively large surface area of the second contact surface 2, the free end 7 of the wire 6 may also be readily fastened thereon with, for example, a glue connection.

Figure 4:
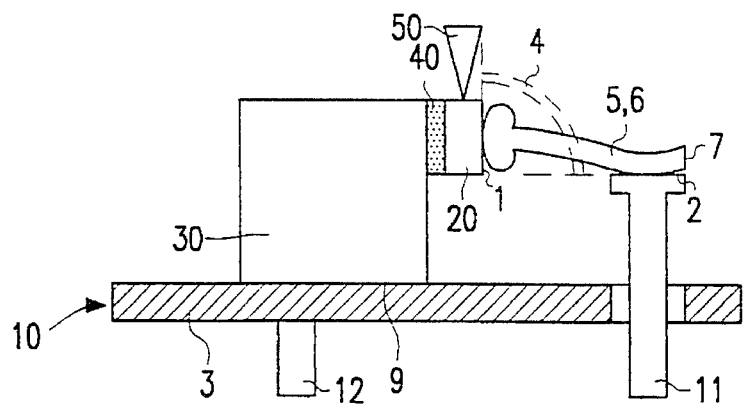

The wire 6 having the free end 7 is preferably given an angle 8 relative to the first contact surface 1 (see FIG. 2) which is chosen to be approximately equal to the angle 4 enclosed by the contact surfaces 1, 2 after fastening of the diode laser 20 on the carrier 3 (see FIG. 4). As a result, the wire 6 having the free end 7 runs approximately parallel to the second contact surface 2 after fastening of the diode laser 20, which facilitates the fastening on this second contact surface. The angle 8 may in addition be adapted to a posible difference in spacing between the contact surfaces 1, 2 and the carrier 3. The provision of the angle 8 in the present example has been effected in that, after the wire 6 was provided on the diode laser 20, the head of the wire bonding unit was moved up perpendicularly, followed by cutting off of the wire 6. The angle 8 may alternatively be shaped afterwards or corrected, for example, by means of an instrument suitable for this purpose such as a two-pronged fork. The wire 6 having the free end 7 has a good stability in that the wire was provided on the first contact surface 1 by means of a so-called bump connection.

The support body 30 is here fastened on the carrier 3 by means of a side surface 9, for example, by soldering or with an electrically conducting glue. The second electrical connection of the diode laser 20 is formed here by the electrically conducting support body 30, the carrier 3 which comprises a metal, and a pin 12 also of metal and connected to the carrier 3. It is also possible for the support body 30 to be fastened on a portion of the carrier 3 with its side which rests on the working surface W in FIG. 2. In that case, the relevant portion of the carrier 3 should be given an angle relative to the carrier 3 which is required for the optical operation.

The optoelectronic semiconductor element 20, which is fastened on a carrier 30 here and provided with the wire 6 having the free end 7, as shown in FIG. 2, forms an attractive semimanufactured product for the reasons detailed above and is highly suitable for use in a method according to the invention.

The invention is not limited to the embodiment given, because many modifications and variations are possible to those skilled in the art within the scope of the invention. Besides one or several diode lasers, one or several other optoelectronic elements may be used, such as LEDs (Light Emitting Diodes), photodiodes and phototransistors. An important modification relates to the mounting of an optoelectronic component on a perfectly plane carrier on which plane connection areas are present, as is the case with a PC-board or a board with a flexible foil thereon which is provided with conductor tracks ending in contact pads.

We claim:

1. A method of manufacturing an optoelectronic semiconductor device, comprising the steps of:

connecting a wire having a first end and a second end to one of an optoelectronic semiconductor element having a first contact surface and a carrier support having a second contact surface at the first end of the wire:

attaching the optoelectronic semiconductor element to the carrier support so that the first contact surface and the second contact surface enclose an angle between the surfaces; and connecting the wire to a different one of the first contact surface and the second contact surface at the second end of the wire, whereby the non parallel surfaces of the optoelectronic semiconductor element and the carrier support are connected by a single wire.

2. The method as claimed in claim 1, wherein the first end of the wire is connected to the first contact surface before the optoelectronic semiconductor element is attached to the carrier.

3. The method as claimed in claim 1, wherein the optoelectronic semiconductor element is attached to a support body, and the support body is attached to the carrier support.

4. The method as claimed in claim 1, further comprising the step of orienting the second end of the wire relative to the contact surface to which the wire will be connected, at an angle that is approximately equal to the angle enclosed by the two contact surfaces when the optoelectronic semiconductor element is attached to the carrier support.

5. The method as claimed in claim 1, wherein the connection of both the first and second ends of the wire to the contact surfaces is done by one of the thermocompression, ultrasonic bonding and bump connections.

6. The method as claimed in claim 3, wherein the enclosed angle is formed by tilting the support body surface and attaching the support body surface to the carrier support along a side surface of the support body surface.

7. The method as claimed in claim 1, wherein the enclosed angle has a value between approximately 10° and 90°.

8. A method as claimed in claim 1 wherein a semiconductor diode laser is the optoelectronic semiconductor element.

9. A method of manufacturing an optoelectronic device having an optoelectronic semiconductor element, comprising the steps of:

providing a first contact surface on said optoelectronic semiconductor element;

providing a carrier for mounting said optoelectronic semiconductor element, a second contact surface being disposed on said carrier, said first and second contact surfaces are non-parallel and being disposed at an angle with respect to each other;

fastening a first end of a conductive wire to one of said first and second contact surfaces;

fastening the optoelectronic semiconductor element on the carrier, and fastening a second end of the wire to the other of said first and second contact surfaces to provide a first electrical connection to said optoelectronic semiconductor element.

10. The method as claimed in claim 9, further including the step of providing a conductive supporting member and disposing said conductive supporting member between the optoelectronic semiconductor element and the carrier to provide a second electrical connection to said optoelectronic semiconductor element.

11. The method as claimed in claim 9 wherein the wire is fastened to the first contact surface of the optoelectronic semiconductor element before the optoelectronic semiconductor element is fastened on the carrier.

12. The method as claimed in claim 9 wherein at least one of the fastenings of the wire to said first and second contact surfaces comprises at least one of the techniques of thermocompression, ultrasonic bonding and bump connection.

13. The method as claimed in claim 9 wherein said first and second contact surfaces are disposed approximately at right angles to each other.

* * * * *